(12) United States Patent
Roberts

(10) Patent No.: US 8,146,973 B2
(45) Date of Patent: Apr. 3, 2012

(54) TENDON ENHANCED END EFFECTOR

(75) Inventor: John Roberts, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1056 days.

(21) Appl. No.: 12/047,637

(22) Filed: Mar. 13, 2008

(65) Prior Publication Data

US 2009/0232630 A1 Sep. 17, 2009

(51) Int. Cl.
*B66C 1/02* (2006.01)
*B66F 19/00* (2006.01)
*B25J 15/06* (2006.01)

(52) U.S. Cl. ............ 294/213; 294/907; 414/941; 901/30

(58) Field of Classification Search .................... 294/1.1, 294/213, 907, 103.1; 414/941, 935, 222.01, 414/744.8, 749.1; 901/30, 31, 33, 46
See application file for complete search history.

(56) References Cited

U.S. PATENT DOCUMENTS

| | | | |
|---|---|---|---|
| 5,746,460 A | 5/1998 | Marohl et al. | |
| 6,068,316 A * | 5/2000 | Kim et al. | 294/186 |
| 6,117,238 A | 9/2000 | Begin | |
| 6,149,367 A | 11/2000 | Begin | |
| 6,159,087 A | 12/2000 | Birang et al. | |
| 6,267,423 B1 | 7/2001 | Marohl et al. | |
| 6,409,453 B1 | 6/2002 | Brodine et al. | |
| 6,634,686 B2 | 10/2003 | Hosokawa | |
| 6,752,585 B2 * | 6/2004 | Reimer et al. | 414/941 |
| 7,073,834 B2 | 7/2006 | Matsumoto et al. | |
| 2006/0192400 A1 * | 8/2006 | Kim et al. | 294/103.1 |

* cited by examiner

*Primary Examiner* — Paul T Chin
(74) *Attorney, Agent, or Firm* — Patterson & Sheridan, L.L.P.

(57) ABSTRACT

An end effector assembly for a substrate transfer robot is described. The end effector assembly includes a robot wrist. At least one end effector is secured to the robot wrist. The end effector has a fixed end, a free end, a load-supporting surface and a tension member. The fixed end is coupled with the robot wrist. The free end is disposed opposite to the fixed end. The load-supporting surface is coupled between the fixed end and the free end. The tension member is coupled with the load-supporting surface between the fixed end and the free end.

11 Claims, 8 Drawing Sheets

TENDON ENHANCED END EFFECTOR

BACKGROUND OF THE INVENTION

1. Field of the Invention

The invention relates to a substrate transfer apparatus for electronic device fabrication.

2. Description of the Related Art

When multiple processes are to be performed on a substrate in multiple chambers, the substrate will be transferred between processing chambers. Such processes include etching, deposition, passivation, polishing, etc. In some processes, a sealed environment must be maintained to limit the likelihood of contamination.

As the demand for larger flat panel displays increases, so does the substrate size for fabricating the displays. In some cases, a single substrate will be used for fabricating multiple flat panel displays. In other cases, a single substrate will be used to fabricate a single flat panel display. The substrates for flat panel displays have increased in size to over 55,000 cm$^2$ in surface area and are expected to continue to grow in size.

With an increase is substrate size may come in increase in substrate weight. Simply increasing the size of the apparatus that transfers the substrate between processing chambers may not be sufficient for transferring the substrates. When increasing the size of the apparatus, a point may come where the apparatus simply may not have the mechanical strength to support the substrate.

Thus, there is a need in the art for an apparatus and a method of transferring large area substrates.

SUMMARY OF THE INVENTION

According to one embodiment of the invention, an end effector assembly for a substrate transfer robot is provided. The end effector assembly includes a robot wrist. At least one end effector is secured to the robot wrist. The end effector has a fixed end, a free end, a load-supporting surface and a tension member. The fixed end is coupled with the robot wrist. The free end is disposed opposite to the fixed end. The load-supporting surface is coupled between the fixed end and the free end. The tension member is coupled with the load-supporting surface between the fixed end and the free end.

In another embodiment, a substrate transfer apparatus includes an end effector assembly, a sensor, and a controller. The end effector assembly has a robot wrist and at least one end effector secured to the robot wrist. The end effector has a fixed end coupled with the robot wrist, a free end disposed opposite to the fixed end, a load-supporting surface coupled between the fixed end and the free end, and a tension member coupled with the load-supporting surface between the fixed end and the free end. The sensor is coupled with the end effector assembly. The controller is coupled with the sensor and the tension member.

In another embodiment, a method of transferring a substrate with an end effector having a fixed end coupled with the robot wrist, a free end disposed opposite to the fixed end, a load-supporting surface coupled between the fixed end and the free end, and a tension member coupled with the load-supporting surface between the fixed end and the free end is provided. The method comprises disposing a substrate onto the load-supporting surface, detecting a bending of the load-supporting surface beyond a predetermined limit, and compensating for the detected bending.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein are generally directed to a substrate transfer robot and an end effector assembly. A tension member is coupled with the end effector to enhance its overall strength so that the end effector may support a substrate disposed thereon while reducing any bowing of the end effector beyond a predetermined amount such that the end effector may be maintained in a substantially flat orientation.

Figure 1A:
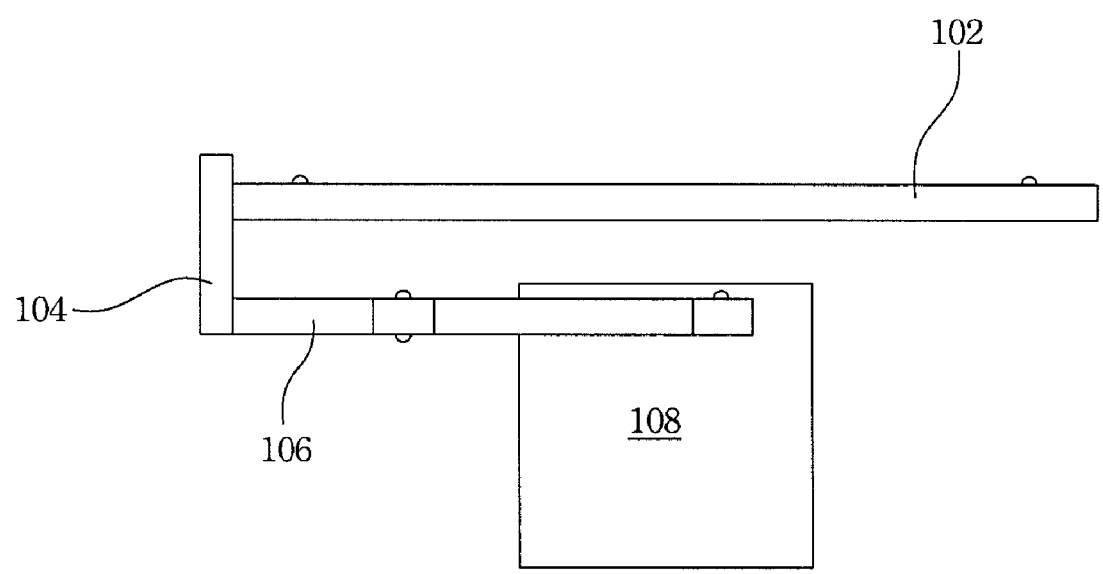
FIG. 1A is a schematic cross sectional view of an end effector.
Figure 1B:
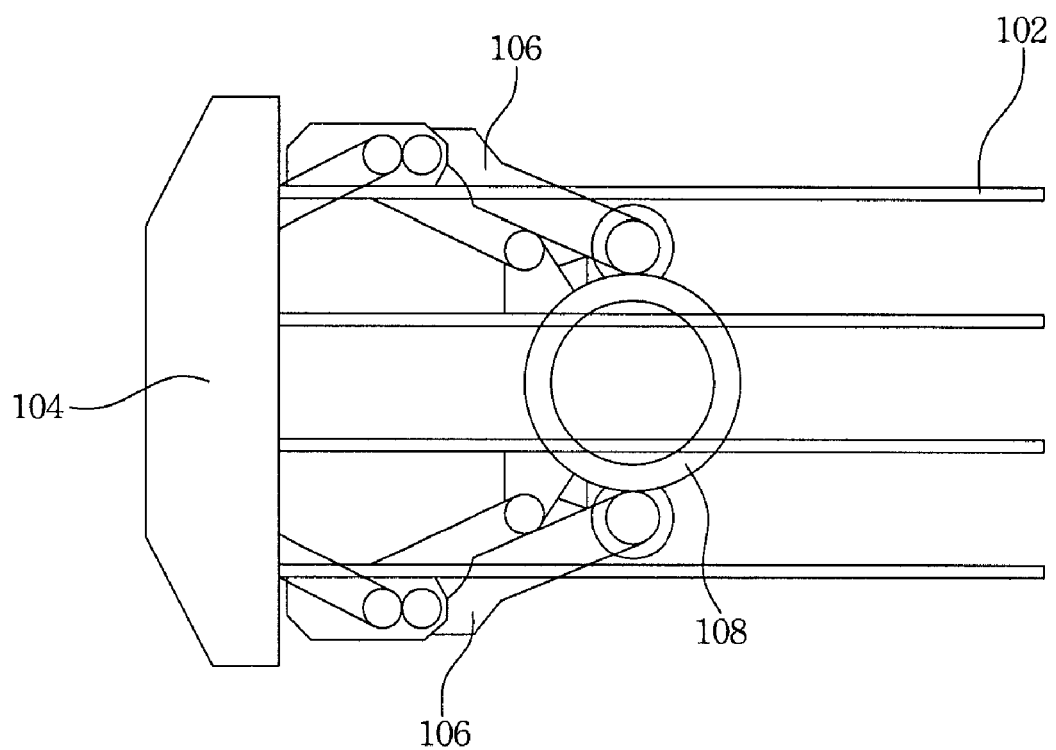
FIG. 1B is a top view of the end effector of FIG. 1A.

FIG. 1A is a cross sectional view of an end effector 102 according to one embodiment of the invention. FIG. 1B is a top view of the end effector 102 of FIG. 1A. Several end effectors 102 are secured to a robot wrist 104 and can collectively support a substrate thereon. The robot wrist 104 is secured to a frog-leg robot arm 106 (as illustrated in FIG. 1B), which is rotatably connected on a stage 108. The stage 108 houses one or more motors (not shown) utilized to control the position of end effectors 102. By rotating the robot arm 106, the robot wrist 104 and its end effectors 102 can be directed to a desired position. One suitable end effector 102 which may be adapted to benefit from the described embodiments is available from Applied Materials, Inc., located in Santa Clara, Calif. It is to be understood that the invention is equally applicable to other end effectors, including those made by other manufacturers.

Figure 2A:
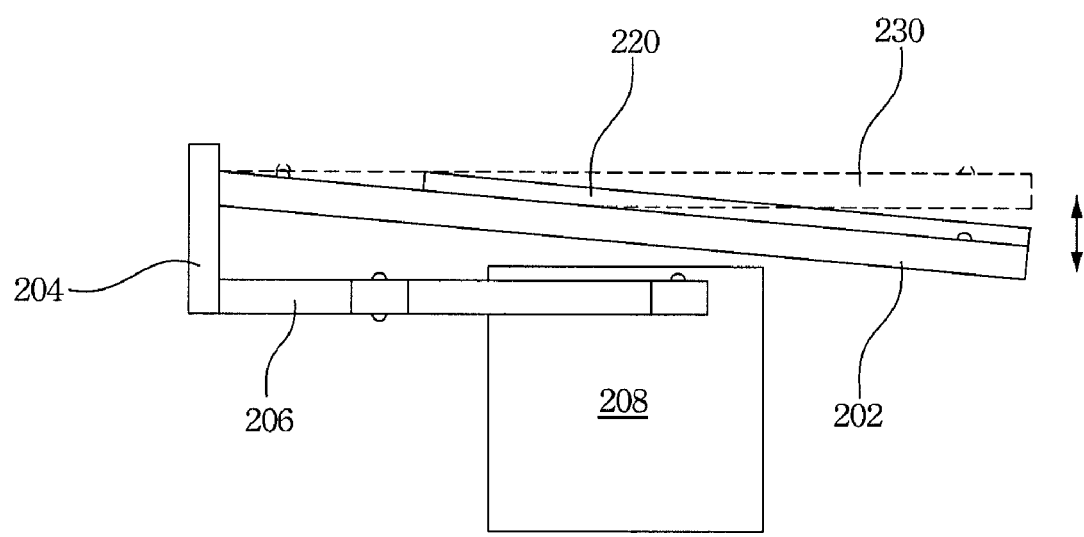
FIG. 2A is a schematic side view of an end effector having a substrate disposed thereon.
Figure 2B:
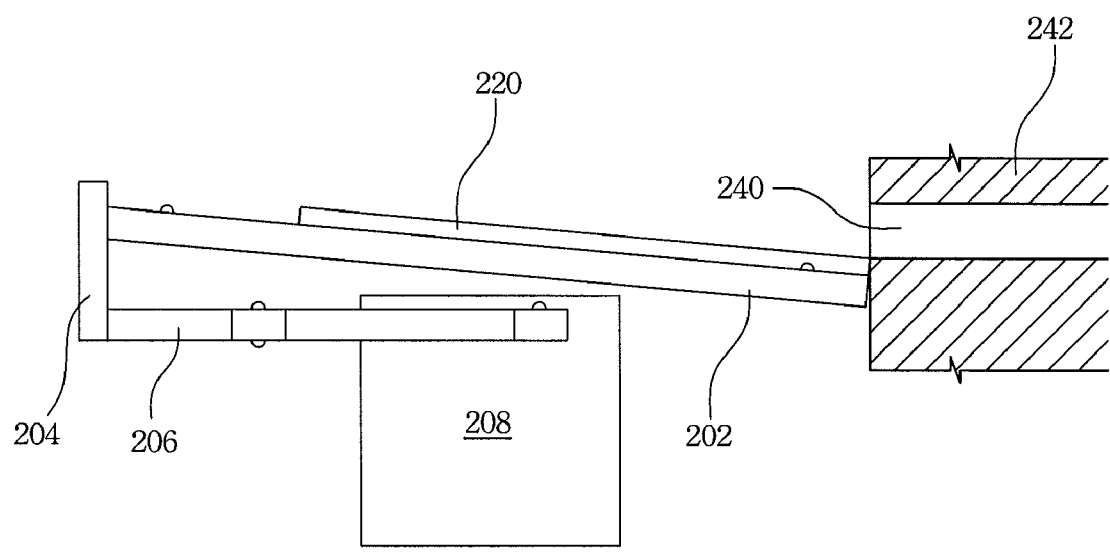
FIG. 2B is a schematic cross sectional view of an end effector bent beyond a predetermined amount.

FIG. 2A is a schematic side view of an end effector having a substrate 220 disposed thereon. The end effector 202 may be secured to a robot wrist 204 secured to a robot arm 206 that is rotatably connected to a stage 208. When a substrate 220 is placed on the end effector 202, the end effector 202 may bow from a normal position 230. The larger and heavier the substrate, the greater the likelihood that the end effector 202 may bow. The end effector 202 bows due to the weight of the substrate. In many cases, this bowing may be quite extreme. Referring to FIG. 2B, the end effector 202 bows to an extent sufficient to prevent the substrate 220 from being disposed through a process port 240. The end effector 202 may hit the chamber wall 242 because the end effector 202 has a downward deflection. The downward deflection may be caused by the weight of the substrate 220.

Figure 3:
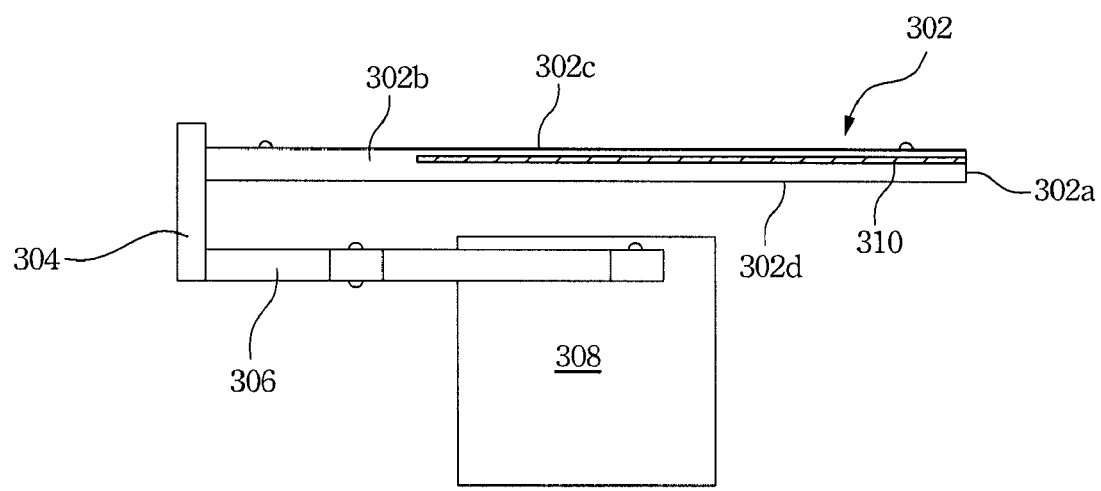
FIG. 3 is a schematic cross sectional view of an end effector according to one embodiment of the invention.

In order to overcome such bowing of the end effector, a stiffened end effector may be necessary. FIG. 3 is a schematic cross sectional view of an end effector according to one embodiment of the invention. The end effector 302 may be secured to a robot wrist 304 secured to a robot arm 306 rotatably connected to a stage 308. In this embodiment, a tension member 310 is installed in the end effector 302 to enhance an overall hardness and to reduce any bowing of the end effector 302. The end effector 302 includes a fixed end 302b and a free end 302a. The fixed end 302b is coupled with the robot wrist 304. The free end 302a is disposed opposite to the fixed end 302b. A load-supporting surface 302c is provided between the fixed end 302b and the free end 302a to support a substrate thereon. A second surface 302d is provided between the fixed end 302b and the free end 302a, and opposite to the load-supporting surface 302c. The tension member 310 may have a greater hardness than the load-supporting surface 302c. In one embodiment, the tension member 310 is closer to the load-supporting surface 302c than the second surface 302d. In another embodiment, the tension member 310 is disposed substantially equidistant from the load-supporting surface 302c and the second surface 302d.

When a substrate is placed on the load-supporting surface 302c, the tension member 310 and the load-supporting surface 302c collectively share a tension force, whereas the second surface 302d bears a compression force. The tension member 310 may resist deflection and thus reduce any sagging of the load-supporting surface 302c. Thus, the load-supporting surface 302c may support a substrate without bowing beyond a predetermined amount. In one embodiment, the tension member 310 may comprise stainless steel. In another embodiment, the tension member 310 may comprise Kevlar. In another embodiment, the tension member 310 may comprise Vectran materials. The tension member 310 may be substantially sealed or enclosed within the end effector 302 so as to prevent chemical corrosion within the process chamber. In one embodiment, the second surface 302d may be at least partially removed such that the tension member 310 may be exposed. In addition, the tension member 310 may be disposed substantially in parallel with the load-supporting surface 302c.

Figure 4A:
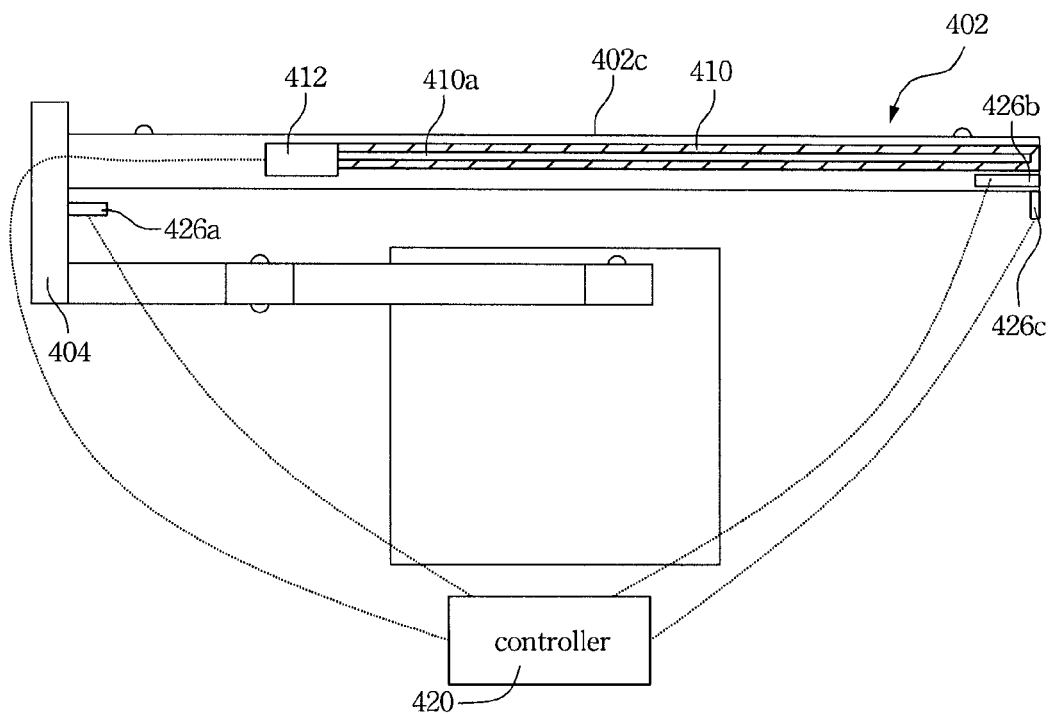
FIG. 4A is a schematic cross sectional view of an end effector according to another embodiment of the invention.
Figure 4B:
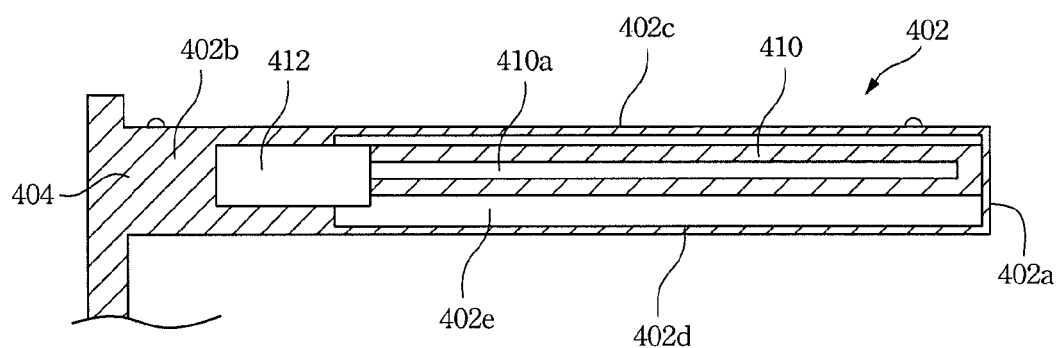
FIG. 4B is an enlarged cross sectional view of the end effector illustrated in FIG. 4A.

FIG. 4A is a schematic cross sectional view of an end effector 402 according to another embodiment of the invention. FIG. 4B is an enlarged view of the end effector 402. The end effector 402 may be secured to a robot wrist 404. In this embodiment, the end effector 402 is equipped with an "active" tension member 410, which stiffens the end effector 402 in response to a detected deflection thereof. A tilt sensor 426a may be installed within the end effector 402 or a tilt sensor 426b may be installed under the end effector 402 (or the second surface) in order to detect any deflection of the load-supporting surface 402c. In one embodiment, the tilt sensor 426a may comprise a light source and may be coupled to the fixed end 402b of the end effector 402. The tilt sensor 426a emits a light beam towards a tilt sensor 426c, which is coupled to the free end 402a of the end effector 402 as a light receiver. If the end effector 402 bends or bows over a predetermined limit, the receiver 426c cannot receive the light beam, and the load-supporting surface 402c has bent beyond the predetermined limit.

A tension-adjusting device 412 enables the tension member 410 to be "active" in compensating for any bending of the end effector 402 beyond the predetermined limit. As stated above, the tension member 410 bears a tension force when a substrate is disposed on the load-supporting surface 402c. In one embodiment, the tension-adjusting device 412 pulls the tension member 410 to compensate for the bending of the end effector 402 after the load-supporting surface 402c and opposite surface 402d bow. The end effector 402 is compensated gradually until the load-supporting surface 402c is substantially flat or above the predetermined bending limit. The tension-adjusting device 412 may comprise a jackscrew, solenoid, magneto-restrictive device, piezo-electrics, motorized reel, or capstan. The tension-adjusting device 412 may counter balance or pull the end effector 402 to prevent sagging o the end effector 402.

In another embodiment, the end effector 402 may be strengthened by stiffening the tension member 410 itself by flowing a high-pressure hydraulic fluid into a hollow space 410a inside the tension member 410. A controller 420, which may be coupled between the tilt sensor 426a and the receiver 426c (or the tilt sensor 426b) and the tension-adjusting device 412. The controller 420 may receive the information regarding the end effector 402 bowing and direct the tension-adjusting member 410 to compensate for the end effector 402 bending beyond the predetermined limit.

Figure 5:
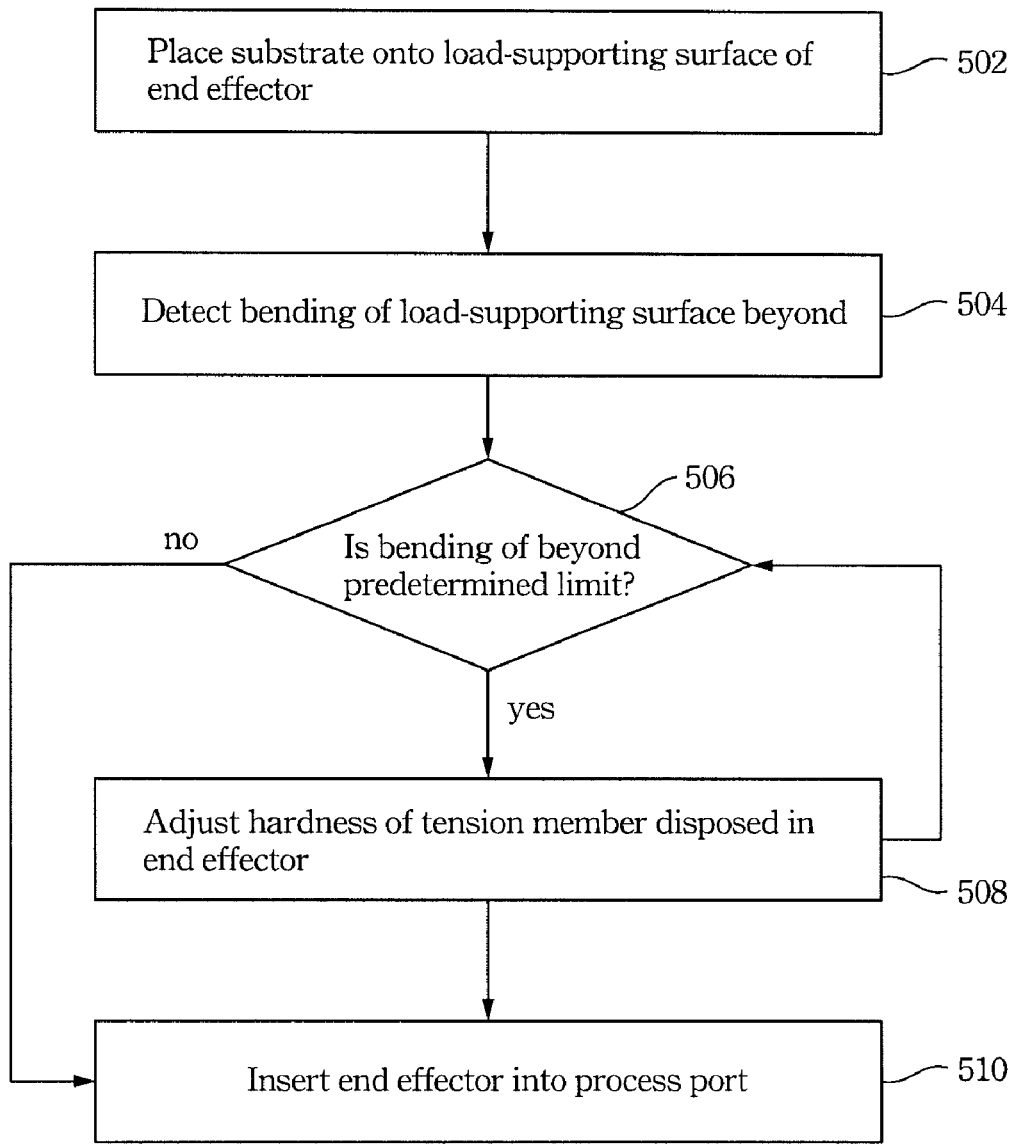
FIG. 5 is a flow chart illustrating a process of compensating for end effector bending according to one embodiment of the invention.
Figure 6:
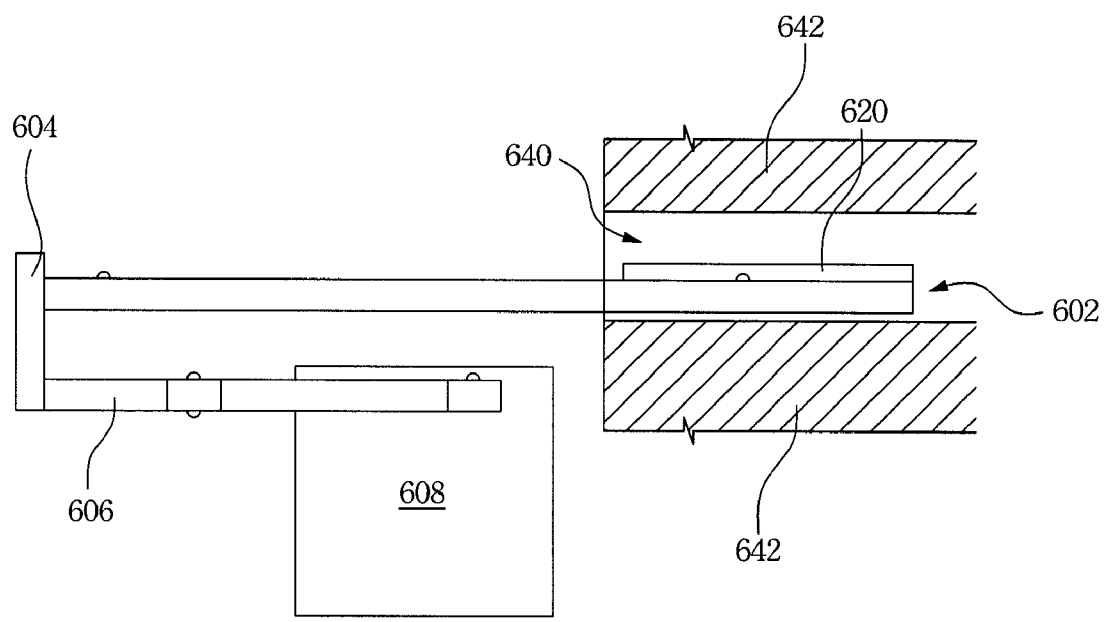
FIG. 6 is a schematic cross sectional view of an apparatus having an end effector with a tension compensation member according to one embodiment of the invention.

FIG. 5 is a flow chart 500 illustrating a process of compensating for end effector bending according to one embodiment of the invention. FIG. 6 is a schematic drawing showing a substrate 620 disposed on an end effector 602 according to one embodiment of the invention. The end effector 602 may be secured to a robot wrist 604 that is secured to a robot arm 606 rotatably connected to a stage 608. In block 502, a substrate 620 is placed onto the load-supporting surface of the end effector 602. In block 504 and/or block 506, a tilt sensor is used to detect if the load-supporting surface bends beyond a predetermined limit. In block 508, a controller directs a tension-adjusting device to adjust the hardness of the end effector 602. The tension member can be pulled to stiffen the end effector 602 and compensate for the bending of the load-supporting surface. Alternatively, the tension member can be stiffened by flowing a high-pressure hydraulic fluid into a hollow space inside thereof. The end effector 602 would be stiffened gradually until the load-supporting surface no longer bends beyond the predetermined limit. Then, in block 510, the end effector successfully loads the substrate 620 into a process port 640 of a chamber 642.

In embodiments discussed herein, the end effector may be hollow or have a cavity (such as a hollow portion 402e illustrated in FIG. 4B) for accommodating and operating the tension member therein. The end effector may be relatively light compared to a solid end effector without a hollow space inside.

According to the forgoing embodiments, the improved end effector assembly has the advantages of supporting a heavy substrate with reduced bowing. Moreover, the improved end effector can be kept relatively light and equipped with an active tension member so as to carry substrates of different weights.

While the foregoing is directed to embodiments of the present invention, other and further embodiments of the invention may be devised without departing from the basic scope thereof, and the scope thereof is determined by the claims that follow.

The invention claimed is:

1. An end effector assembly for a substrate transfer robot, comprising:

a robot wrist;
at least one end effector coupled to the robot wrist, the end effector having:
a fixed end coupled with the robot wrist;
a free end disposed opposite to the fixed end;
a load-supporting surface disposed between the fixed end and the free end; and
a tension member coupled with the load-supporting surface between the fixed end and the free end, the tension member having a hollow body; and
a controller coupled with the tension member, the controller operable to direct a hydraulic fluid into the hollow body of the tension member.

2. The end effector assembly of claim 1, further comprising a second surface disposed between the fixed end and the free end, wherein the tension member is coupled between the load-supporting surface, the fixed end, the free end, and the second surface.

3. The end effector assembly of claim 2, further comprising a tilt sensor disposed below the second surface.

4. The end effector assembly of claim 1, further comprising a tilt sensor disposed below the load-supporting surface.

5. A substrate transfer apparatus, comprising:
an end effector assembly having a robot wrist and at least one end effector secured to the robot wrist, the end effector having a fixed end coupled with the robot wrist, a free end disposed opposite to the fixed end, a load-supporting surface coupled between the fixed end and the free end, and a tension member coupled with the load-supporting surface between the fixed end and the free end, the tension member having a hollow body;
a sensor coupled with the end effector assembly; and
a controller coupled with the sensor and the tension member, the controller operable to direct a hydraulic fluid into the hollow body of the tension member.

6. The substrate transfer apparatus of claim 5, further comprising a tension-adjusting device coupled with the controller and the tension member.

7. The substrate transfer apparatus of claim 6, wherein the tension-adjusting member comprises a fluid source.

8. A method of transferring a substrate with an end effector having a fixed end coupled with the robot wrist, a free end disposed opposite to the fixed end, a load-supporting surface coupled between the fixed end and the free end, and a tension member coupled with the load-supporting surface between the fixed end and the free end, the tension member having a hollow body, the method comprising:
disposing a substrate onto the load-supporting surface;
detecting a bending of the load-supporting surface beyond a predetermined limit; and
compensating for the detected bending by introducing a hydraulic fluid into the hollow body of the tension member.

9. The method of transferring a substrate of claim 8, wherein the detecting comprises using a sensor to detect the load-supporting surface bending.

10. The method of claim 8, wherein the detecting comprises directing a light from a light source coupled to the fixed end and disposed under the load-supporting surface at a receiver coupled to the free end and disposed under the load-supporting surface.

11. The method of transferring a substrate of claim 8, wherein the tension member is substantially enclosed within the end effector.

* * * * *